(12) United States Patent
Chiang et al.

(10) Patent No.: US 10,027,321 B2
(45) Date of Patent: Jul. 17, 2018

(54) I/O DRIVING CIRCUIT AND CONTROL SIGNAL GENERATING CIRCUIT

(71) Applicant: MEDIATEK INC., Hsin-Chu (TW)

(72) Inventors: Chen-Feng Chiang, Chiayi County (TW); An-Siou Li, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 167 days.

(21) Appl. No.: 14/746,856

(22) Filed: Jun. 23, 2015

(65) Prior Publication Data

US 2016/0173085 A1 Jun. 16, 2016

Related U.S. Application Data

(60) Provisional application No. 62/090,890, filed on Dec. 12, 2014.

(51) Int. Cl.

| H03K 17/0814 | (2006.01) |
|---|---|
| H03K 17/687 | (2006.01) |
| H03K 19/0185 | (2006.01) |
| H03K 17/693 | (2006.01) |
| H03K 19/00 | (2006.01) |
| H03K 19/003 | (2006.01) |

(52) U.S. Cl.
CPC ... *H03K 17/6871* (2013.01); *H03K 17/08142* (2013.01); *H03K 17/693* (2013.01); *H03K 19/0027* (2013.01); *H03K 19/00384* (2013.01); *H03K 19/018521* (2013.01)

(58) Field of Classification Search
CPC ......... H03K 17/08104; H03K 17/0812; H03K 17/08122; H03K 17/08142; H03K 17/102; H03K 17/6871–17/6874; H03K 17/693; H03K 19/0027; H03K 19/00384; H03K 19/018521

See application file for complete search history.

(56) References Cited

U.S. PATENT DOCUMENTS

| 5,982,211 A | * | 11/1999 | Ko ........................ H03K 17/693 327/202 |
|---|---|---|---|
| 6,028,449 A | | 2/2000 | Schmitt |
| 7,068,091 B1 | * | 6/2006 | Kwong .......... H03K 19/018521 327/333 |
| 7,154,309 B1 | * | 12/2006 | Talbot .............. H03K 17/08122 327/108 |

(Continued)

FOREIGN PATENT DOCUMENTS

| CN | 1414561 A | 4/2003 |
|---|---|---|
| CN | 1507054 A | 6/2004 |
| CN | 103516350 A | 1/2014 |

*Primary Examiner* — Patrick O'Neill
(74) *Attorney, Agent, or Firm* — Winston Hsu

(57) ABSTRACT

An I/O driving circuit comprising a post driver. The post driver comprises: a first switch device, comprising a first terminal coupled to an I/O voltage, and comprising a second terminal, wherein the first switch device provides an initial driving voltage at the second terminal of the first switch device; and a first voltage providing device, comprising a first terminal coupled to the second terminal of the first switch device, and comprising a second terminal. The first voltage providing device is configured to provide a driving voltage at the second terminal of the first voltage providing device via providing a voltage drop to the initial driving voltage.

14 Claims, 7 Drawing Sheets

(56) References Cited

U.S. PATENT DOCUMENTS

| | | | | |
|---|---|---|---|---|
| 7,863,962 B2* | 1/2011 | Pasqualini | ..... | H03K 19/018521 |
| | | | | 326/81 |
| 7,999,523 B1* | 8/2011 | Caffee | .............. | H03K 19/00361 |
| | | | | 323/225 |
| 8,030,964 B1* | 10/2011 | Shih | ............... | H03K 19/018521 |
| | | | | 326/68 |
| 8,994,412 B2 | 3/2015 | Kim | | |
| 9,143,133 B2* | 9/2015 | Liu | ................ | H03K 19/018521 |
| 2003/0080780 A1 | 5/2003 | Okamoto | | |
| 2010/0271118 A1 | 10/2010 | Bhattacharya | | |
| 2011/0102070 A1 | 5/2011 | Chen | | |

* cited by examiner

I/O DRIVING CIRCUIT AND CONTROL SIGNAL GENERATING CIRCUIT

CROSS REFERENCE TO RELATED APPLICATIONS

This application claims the benefit of U.S. Provisional Application No. 62/090,890, filed on Dec. 12, 2014, the contents of which are incorporated herein by reference.

BACKGROUND

An I/O driving circuit is applied to provide a driving voltage to drive an electronic device coupled to an I/O pad. FIG. 1 is a block diagram illustrating a conventional I/O driving circuit. As depicted in FIG. 1, the I/O driving circuit 100 comprises a pre-driver 101 and a post driver 103. The pre-driver 101 provides a pre-driving function, which can be an operation for controlling the post driver 103. The post driver 103 is configured to generate the driving voltage V_d to the I/O pad 105.

However, the pre-driver 101 only operates at a single power domain, thus the I/O driving circuit 100 cannot meet requirements of different operating voltage for various standards. Also, the post driver 103 always comprises several PMOSFETs for providing the driving voltage. However, a conventional post driver always applies core devices, which comprises thin oxides, as the PMOSFETs. In such structure, the pre-driver 101 cannot operate between a wide operating voltage range, or the transistors may be broken by the control signals generated by the pre-driver.

SUMMARY

Therefore, one objective of the present application is to provide an I/O driving circuit that can operate in different power domains.

Another objective of the present application is to provide an I/O driving circuit that can suffer a wider operating voltage range.

Another objective of the present application is to provide an I/O driving circuit that can apply a device that can provide a voltage drop function to generate the driving voltage.

Another objective of the present application is to provide a control signal generating circuit that can operate indifferent power domains.

One embodiment of the present application discloses an I/O driving circuit comprising a post driver. The post driver comprises: a first switch device, comprising a first terminal coupled to an I/O voltage, and comprising a second terminal, wherein the first switch device provides an initial driving voltage at the second terminal of the first switch device; and a first voltage providing device, comprising a first terminal coupled to the second terminal of the first switch device, and comprising a second terminal. The first voltage providing device is configured to provide a driving voltage at the second terminal of the first voltage providing device via providing a voltage drop to the initial driving voltage.

Another embodiment of the present application discloses a control signal generating circuit, comprising a plurality of control signal generating blocks, wherein at least one the control signal generating block operates at a first power domain, and at least one the control signal generating block operates at a second power domain.

In view of above-mentioned embodiments, the pre-driver can operate at various power domains thus can match requirements for different standards. Also, the pre-driver can operate at a wide operating voltage range, since the post driver comprises an I/O device. Further, the I/O driving circuit applies a NMOSFET as one device of a pull up circuit, which can provide a voltage drop and more stable, thus the driving voltage is more stable.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
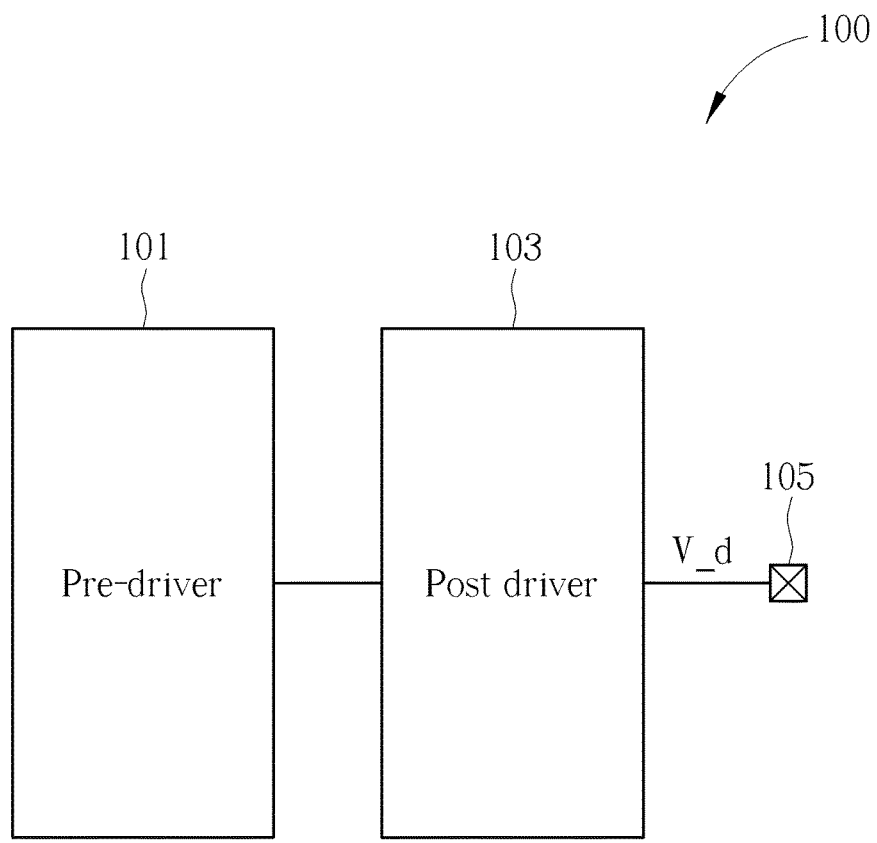
FIG. 1 is a block diagram illustrating a conventional I/O driving circuit.
Figure 2:
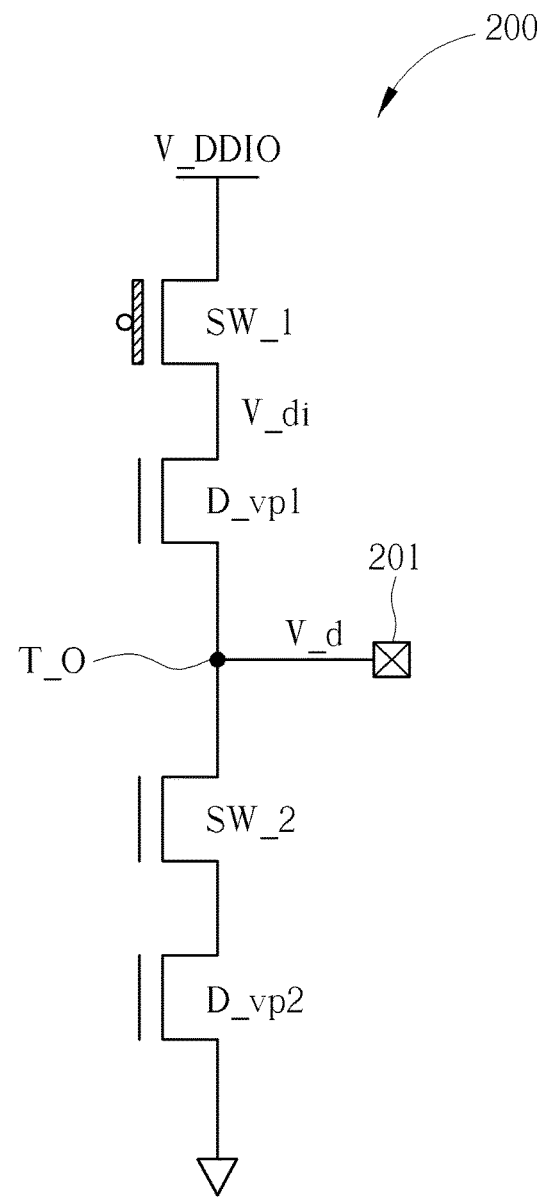
FIG. 2 and FIG. 3 are circuit diagrams illustrating post drivers according to embodiments of the present application.

FIG. 2 is a circuit diagram illustrating a post driver according to an embodiment of the present application. As depicted in FIG. 2, the post driver 200 comprises: a first switch device SW_1, a first voltage providing device D_vp1, a second switch device SW_2 and a second voltage providing device D_vp2. The first switch device SW_1 comprises a first terminal coupled to an I/O voltage VDDIO and comprises a second terminal. Also, the first switch device SW_1 provides an initial driving voltage V_di at the second terminal of the first switch device SW_. The first voltage providing device D_vp1 comprises a first terminal coupled to the second terminal of the first switch device SW_, and comprises a second terminal. The first voltage providing device D_vp1 is configured to provide a driving voltage V_d at the second terminal of the first voltage providing device D_vp1 via providing a voltage drop to the initial driving voltage V_di. The post driver 200 further comprises an output terminal T_o, which is coupled to the second terminal of the first voltage providing device D_vp1 and the I/O pad 201.

In one embodiment, the first switch device SW_1 is an I/O device, and the first voltage providing device D_vp1 is a core device. The operating voltage for an I/O device is higher than which of the core device. Further, the oxide layer for the I/O device is thicker than which of the core device, thereby by the I/O device can suffer a higher voltage.

In one embodiment, the first switch device SW_1 is a PMOSFET, and the first voltage providing device D_vp1 is a NMOSFET. That is, the first switch device SW_1 is a PMOSFET comprising an oxide layer thicker than an oxide layer of the NMOSFET served as the first voltage providing device D_vp1.

Please refer to FIG. 2 again, the post driver 200 further comprises a second switch device SW_2 and a second voltage providing device D_vp2. The second switch device SW_2 comprises a first terminal coupled to the output terminal T_o, and comprises a second terminal. The second voltage providing device D_vp2 comprises a first terminal coupled to the second terminal of the second switch device SW_2, and comprises a second terminal coupled to a ground voltage. In the embodiment depicted in FIG. 2, the second switch device SW_2 and the second voltage providing device D_vp2 are core NMOSFETs (a NMOSFET which is a core device), but not limited.

In the embodiment depicted in FIG. 2, the first switch device SW_1 and the first voltage providing device D_vp1 are served as a pull up circuit configured to pull up the driving voltage V_d. Also, the second switch device SW_2 and the second voltage providing device D_vp2 are served as a pull down circuit configured to pull down the driving voltage V_d. However, the post driver 200 is not limited to comprise the second switch device SW_2 and the second voltage providing device D_vp2. Further, first switch device SW_1 and the first voltage providing device D_vp1 are not limited to serve as a pull up circuit.

Figure 3:
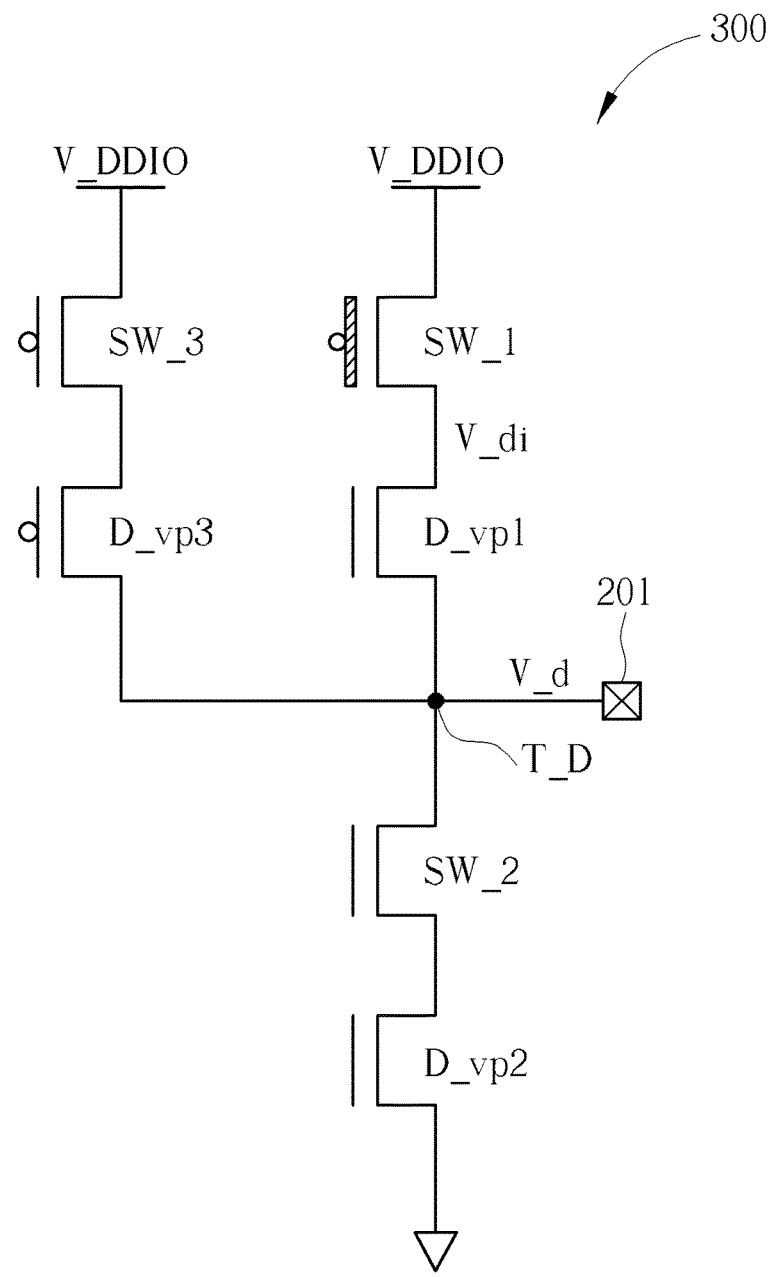

FIG. 3 is a circuit diagram illustrating a post driver according to another embodiment of the present application. In this embodiment, the post driver 300 further comprises a third switch device SW_3 and a third voltage providing device D_vp3. The third switch device SW_3 comprises a first terminal coupled to the I/O voltage VDDIO, and comprises a second terminal. The third voltage providing device D_vp3 comprises a first terminal coupled to the second terminal of the third switch device SW_3, and comprises a second terminal coupled to the output terminal T_o.

In the embodiment of FIG. 3, the third switch device SW_3 and a third voltage providing device D_vp3 are served as a pull up circuit as well. Also, in the embodiment of FIG. 3, the third switch device SW_3 and a third voltage providing device D_vp3 are both core NMOSFETs.

Figure 4:
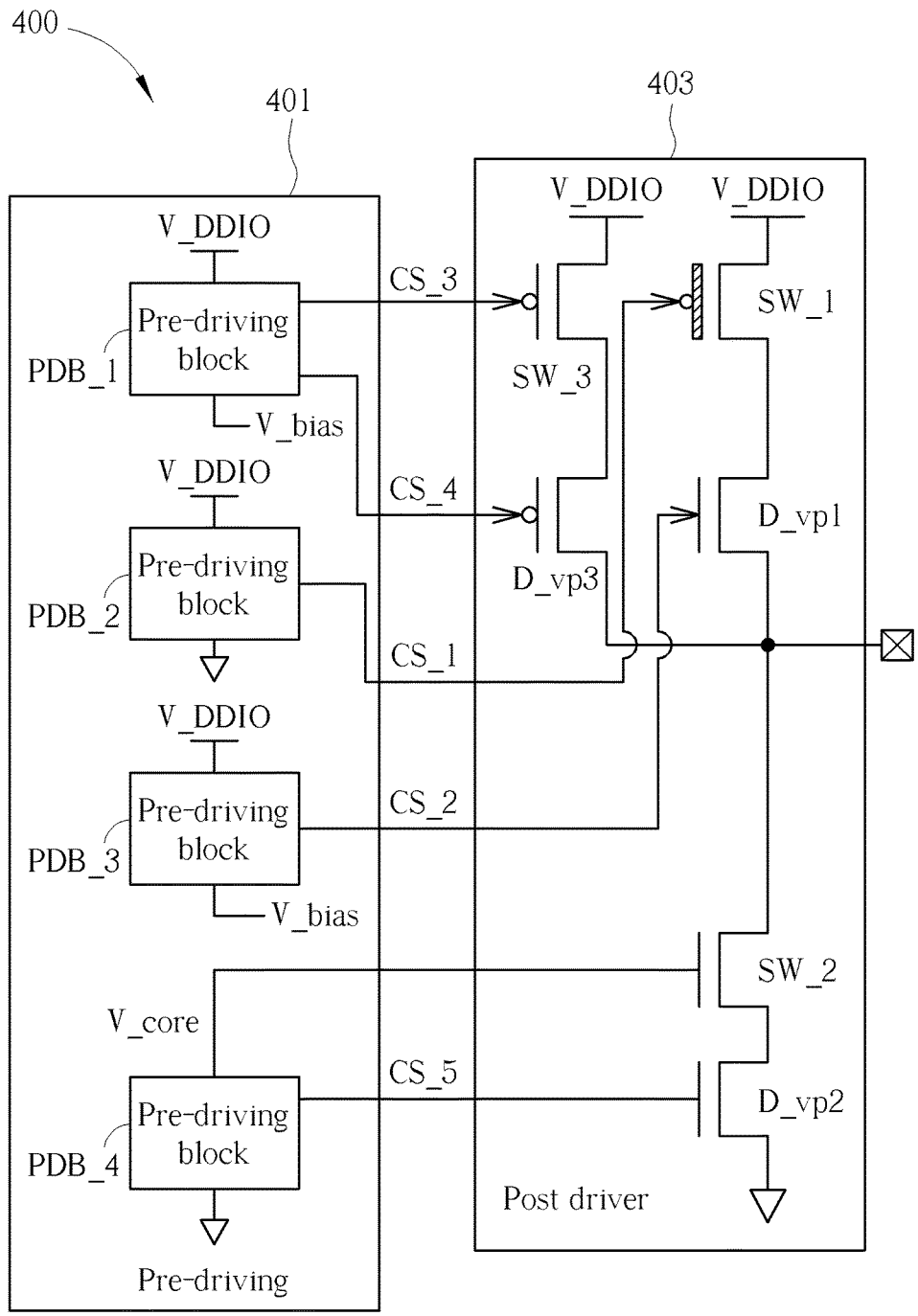
FIG. 4-FIG. 6 are circuit diagrams illustrating I/O circuits according to different embodiments of the present application.
Figure 5:
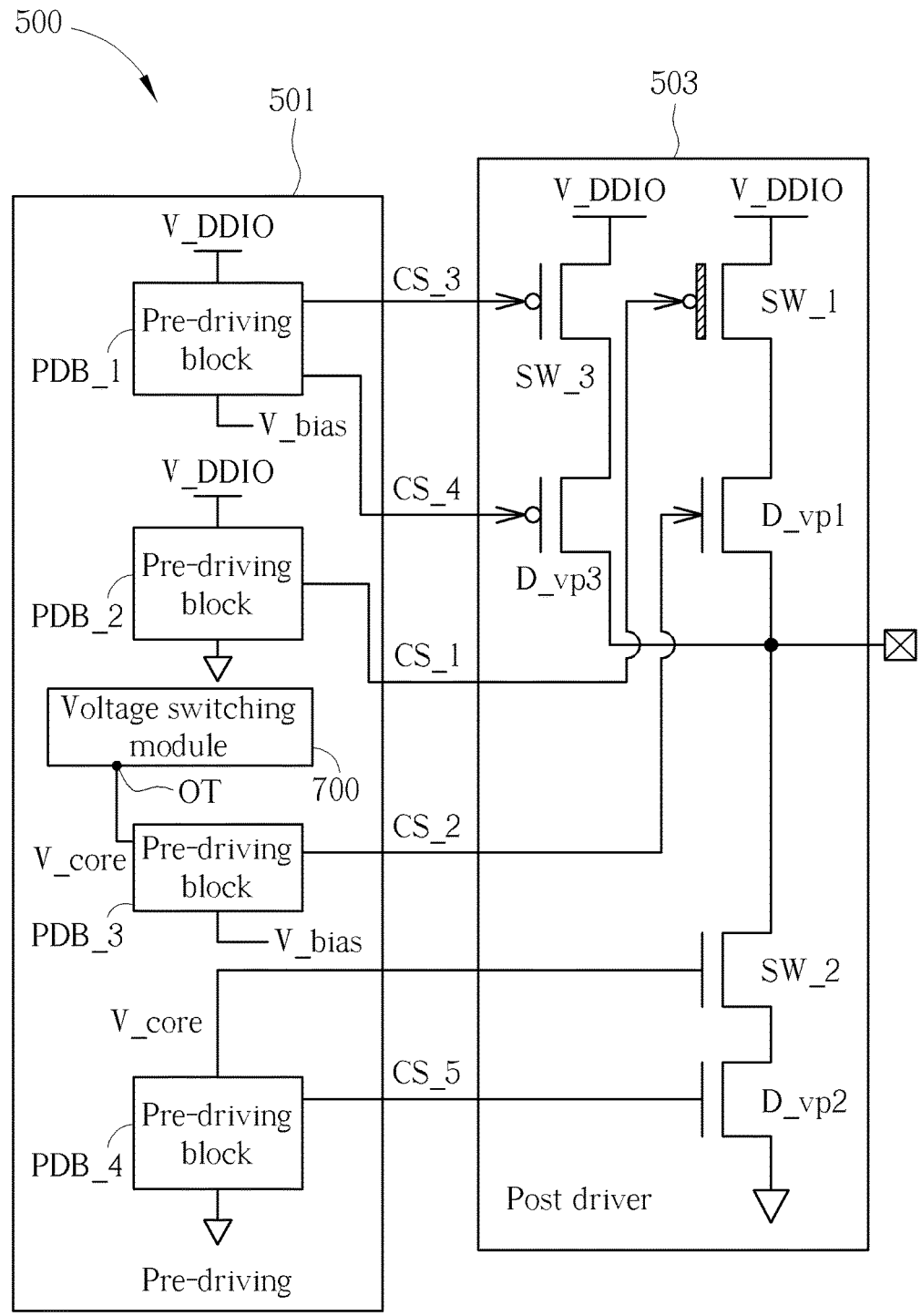
Figure 6:
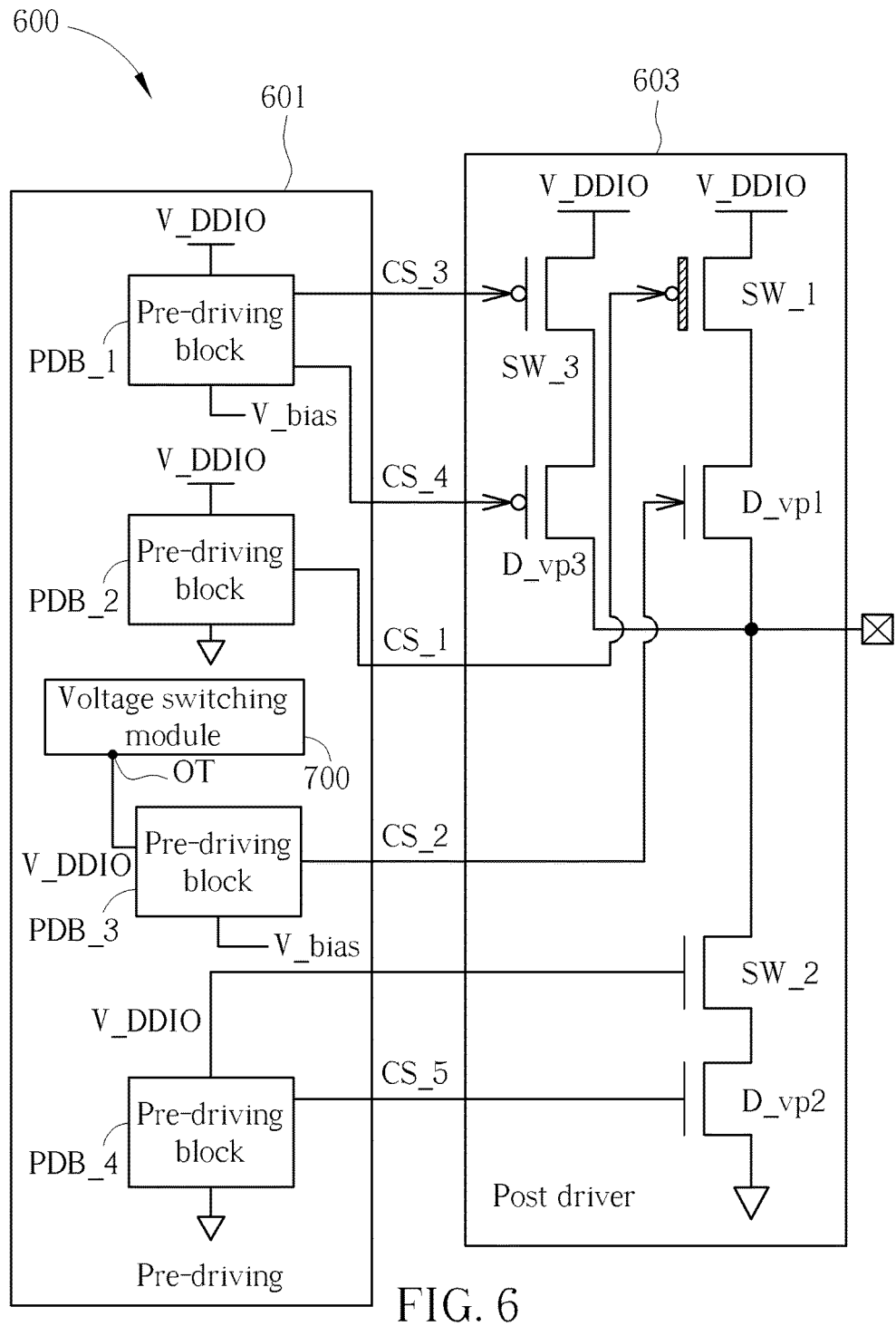

FIG. 4-FIG. 6 are circuit diagrams illustrating I/O circuits according to different embodiments of the present application. In these embodiments, the I/O circuit further comprises a pre-driver. The pre-driver is configured to generate control signals to control the abovementioned switch devices and voltage providing device. The pre-driver comprises a plurality of pre-driving blocks, wherein at least one the pre-driving block operates at a first power domain, and at least one the pre-driving block operates at a second power domain.

For example, at least one the pre-driving block operates between the above-mentioned I/O voltage and a bias voltage, and at least one the pre-driving block operates at the I/O voltage and a ground voltage, wherein the bias voltage is lower than the I/O voltage and higher than the ground voltage. For another example, at least one the pre-driving block operates between the above-mentioned core voltage and the ground voltage, wherein the core voltage is lower than the I/O voltage. For still another example, at least one the pre-driving block further operates between the core voltage and the bias voltage.

In one embodiment, the I/O circuit further comprises: a voltage switch module coupled to the pre-driving blocks. Each of the pre-driving blocks operates at one of the first power domain and the second power domain based on the mode of the voltage switch module. For example, the voltage switch module receives the I/O voltage V_DDIO. In a first mode, the voltage switch module directly passes the I/O voltage V_DDIO to the pre-driving block such that the pre-driving block operates at the I/O voltage V_DDIO. In a second mode, the voltage switch module decreases the I/O voltage V_DDIO to generate the core voltage V_core, such that the pre-driving block operates at the core voltage V_core.

Figure 7:
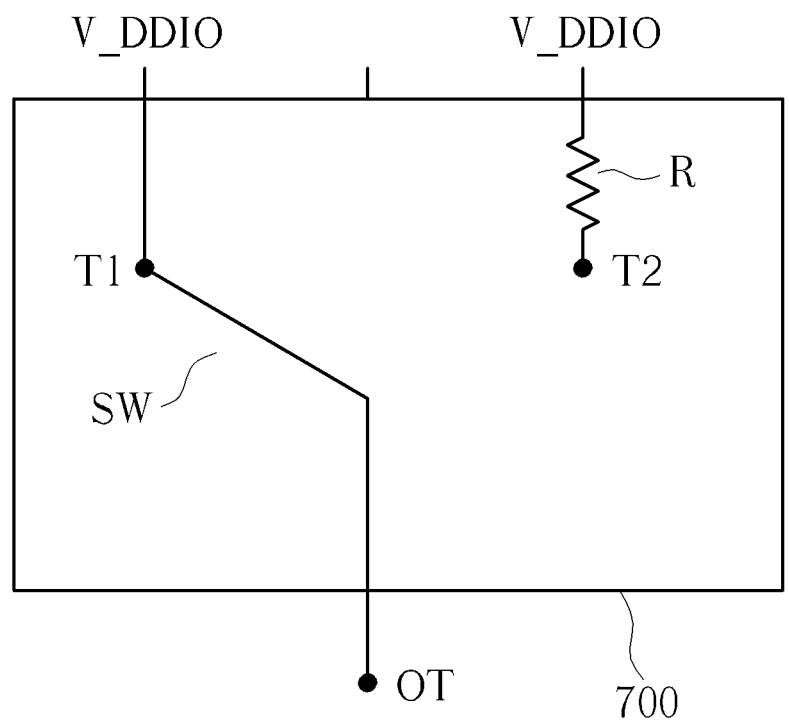
FIG. 7 is a circuit diagram illustrating a voltage switch module 700 according to one embodiment of the present invention

Please refer to FIG. 7, which is a circuit diagram illustrating a voltage switch module 700 according to one embodiment of the present invention. As illustrated in FIG. 7, the voltage switch module 700 comprises a switch device SW which can control the terminal T1 and the output terminal OT to be conductive/non-conductive, and can control the terminal T2 and the output terminal OT to be conductive/non-conductive. In the first mode, the terminal T1 and the output terminal OT are conductive such that the voltage switch module 700 outputs the I/O voltage V_DDIO at the output terminal OT. In the second mode, the terminal T2 and the output terminal OT are conductive, such that the resistor R provides a voltage drop to the I/O voltage V_DDIO, thereby the core voltage V_core is generated and output at the output terminal OT. The output terminal OT is coupled to pre-driving blocks in FIG. 4-FIG. 6.

Details for the I/O circuits illustrated in FIG. 4-FIG. 6 will be described as below. Please refer to FIG. 4, the I/O circuit comprises a pre-driver 401 and a post driver 403. The structure of the post driver 403 is the same as the post driver 300 depicted in FIG. 3, thus it is omitted to describe for brevity here.

The pre-driver 401 comprises a first pre-driving block PDB_1, a second pre-driving block PDB_2, a third pre-driving block PDB_3, and a fourth pre-driving block PDB_4. The pre-driving blocks PDB_1, PDB_2, PDB_3 and PDB_4 comprises circuits that can provide pre-driver functions, for example, logic circuits, buffers or amplifiers. The first pre-driving block PDB_1 is coupled to the third switch device SW_3 and the third voltage providing device D_vp3. The first pre-driving block PDB_1 operates between the I/O voltage V_DDIO and a bias voltage V_bias to generate a third control signal CS_3 for controlling the third switch device SW_3, and to generate a fourth control signal CS_4 for controlling the third voltage providing device D_vp3. The second pre-driving block PDB_2 is coupled to the first switch device SW_1, wherein the second pre-driving block PDB_2 operates between the I/O voltage V_DDIO and the ground voltage to generate a first control signal CS_1 for controlling the first switch device SW_1. Please note, since the first switch device SW_1 can suffer a higher voltage due to a thicker oxide layer, the second pre-driving block PDB_2 can operate at a wide operating range (VDDIO and ground).

The third pre-driving block PDB_3 is coupled to the first voltage providing device D_vp1. The third pre-driving block PDB_3 operates between the I/O voltage V_DDIO and the bias voltage V_bias to generate a second control signal CS_2 for controlling the first voltage providing device. The fourth pre-driving block PDB_4 is coupled to the second voltage providing device D_vp2, wherein the fourth pre-driving block PDB_4 operates between the core voltage V_core and the ground voltage to generate a fifth control signal CS_5 to the second voltage providing device D_vp2. The second switch device D_vp2 comprises a control terminal receiving the core voltage V_core, which is lower than the I/O voltage V_DDIO. The bias voltage V_bias is lower than the I/O voltage V_DDIO and higher than the ground voltage.

Please refer to FIG. 5, the I/O circuit 500 comprises a pre-driver 501 and a post driver 503. The structure of the post driver 503 is the same as the post driver 300 depicted in FIG. 3, thus it is omitted for brevity here. The pre-driver 501 comprises a first pre-driving block PDB_1, a second pre-driving block PDB_2, a third pre-driving block PDB_3, and a fourth pre-driving block PDB_4. The structures of the first pre-driving block PDB_1, the second pre-driving block PDB_2 and the fourth pre-driving block PDB_4 in FIG. 5 are the same as which of the first pre-driving block PDB_1, the second pre-driving block PDB_2 and the fourth pre-driving block PDB_4 in FIG. 4, thus are omitted for brevity here.

In FIG. 5, the third pre-driving block PDB_3 is coupled to the first voltage providing device D_vp1. The third pre-driving block PDB_3 operates between the core voltage V_core and the bias voltage V_bias to generate a second control signal CS_2 for controlling the first voltage providing device D_vp1.

Please refer to FIG. 6, the I/O circuit 600 comprises a pre-driver 601 and a post driver 603 as well. The structure of the post driver 603 is the same as the post driver depicted in FIG. 3, thus it is omitted for brevity here. The pre-driver 601 comprises a first pre-driving block PDB_1, a second pre-driving block PDB_2, a third pre-driving block PDB_3, and a fourth pre-driving block PDB_4. The structures of the first pre-driving block PDB_1, the second pre-driving block PDB_2 and the third pre-driving block PDB_3 in FIG. 6 are the same as which of the first pre-driving block PDB_1, the second pre-driving block PDB_2 and the third pre-driving block PDB_3 in FIG. 4, thus are omitted for brevity here.

In FIG. 6, the fourth pre-driving block PDB_4 is coupled to the second voltage providing device D_vp2. The fourth pre-driving block PDB_4 operates between the I/O voltage V_DDIO and the ground voltage to generate a fifth control signal CS_5 for controlling the second voltage providing device D_vp2. In such embodiment, a control terminal of the second switch device SW_2 is coupled to the I/O voltage V_DDIO. Also, in one embodiment, the I/O voltage V_DDIO or the core voltage V_core is provided via above-mentioned voltage switching module 700 in FIG. 7. As illustrated FIG. 5 and FIG. 6, the third pre-driving block PDB_3 is coupled to the output terminal OT of the voltage switching module 700. In FIG. 5, the voltage switching module 700 outputs the core voltage V_core to the third pre-driving block PDB_3. Besides, in FIG. 6, the voltage switching module 700 outputs the I/O voltage V_DDIO to the third pre-driving block PDB_3. Detail operations for the voltage switching module 700 is described in above-mentioned descriptions, thus are omitted for brevity here.

It will be appreciated that the scope of the present application is not limited to the structure depicted in FIG. 4-FIG. 6. For example, the post drivers 403, 503 and 603 can only comprise the first switch device SW_1 and the first voltage providing device D_vp1. For such structure, the pre-drivers 401, 501 and 601 can only comprise the second pre-driving block PDB_2 and the third pre-driving block PDB_3. Also, the pre-driver provided by the present application is not limited to be applied to the post driver provided by the present application. For such case, the pre-driver can be regarded as a control signal generating circuit comprising a plurality of control signal generating blocks.

Based upon above-mentioned embodiments, requirements for different standards can be met. Two examples of values for all voltages and control signals are provided in the following table 1, but do not mean to limit the scope of the present application.

In view of above-mentioned embodiments, the pre-driver can operate at various power domains thus can match requirements for different standards. Also, the pre-driver can operate at a wide operating voltage range, since the post driver comprises an I/O device. Further, the I/O driving circuit applies a NMOSFET as one device of a pull up circuit, which can provide a voltage drop and more stable, thus the driving voltage is more stable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An I/O driving circuit, comprising:
   a post driver, comprising:
      a first switch device, comprising a first terminal coupled to an I/O voltage, and comprising a second terminal, wherein the first switch device provides an initial driving voltage at the second terminal of the first switch device; and
      a first voltage providing device, comprising a first terminal coupled to the second terminal of the first switch device, and comprising a second terminal, wherein the first voltage providing device is configured to provide a driving voltage at the second terminal of the first voltage providing device via providing a voltage drop to the initial driving voltage;
      wherein an oxide layer of the first switch device is thicker than an oxide layer of the first voltage providing device; and
   a pre-driver, configured to generate a first control signal for controlling the first switch device and to generate a second control signal to control the first voltage providing device;
   wherein the pre-driver comprising a plurality of pre-driving blocks, wherein at least one the pre-driving block operates at a first power domain, and at least one the pre-driving block operates at a second power domain.

2. The I/O driving circuit of claim 1, wherein the first switch device is an I/O device, and the first voltage providing device is a core device.

3. The I/O driving circuit of claim 2, wherein the first switch device is a PMOSFET, and the first voltage providing device is a NMOSFET.

4. The I/O driving circuit of claim 1, wherein at least one the pre-driving block operates between the I/O voltage and a ground voltage.

5. The I/O driving circuit of claim 1, wherein at least one the pre-driving block operates between the I/O voltage and a bias voltage;
   wherein the bias voltage is lower than the I/O voltage and higher than a ground voltage.

| Standard | V_DDIO | V_core | CS_4 | CS_1 | CS_2 | CS_3 | CS_5 |
|---|---|---|---|---|---|---|---|
| 1 | 1.1 v | 1.0 v | 0 v or V_DDIO-V_core | 0 v | 0 v-1.1 v | 1.1 v | 0 v-1.0 v |
| 2 | 1.2 v | 1.0 v | 0 v or V_DDIO-V_core | 1.2 v | 0 v | 0 v-1.2 v | 0 v-1.0 v |

6. The I/O driving circuit of claim 1, wherein at least one the pre-driving block operates between a core voltage and a ground voltage;
wherein the core voltage is lower than the I/O voltage.

7. The I/O driving circuit of claim 1, further comprising an output terminal, wherein the second terminal of the first voltage providing device is coupled to the output terminal, wherein the post driver further comprises:
a second switch device, comprising a first terminal coupled to the output terminal, and comprising a second terminal; and
a second voltage providing device, comprising a first terminal coupled to the second terminal of the second switch device, and comprising a second terminal coupled to a ground voltage.

8. The I/O driving circuit of claim 7, wherein the pre-driver further comprises:
a fourth pre-driving block, coupled to the second voltage providing device wherein the fourth pre-driving block operates between a core voltage and the ground voltage to generate a fifth control signal to the second voltage providing device;
wherein the second switch device comprises a control terminal receiving the core voltage.

9. The I/O driving circuit of claim 1, further comprising:
a third switch device, comprising a first terminal coupled to the I/O voltage, and comprising a second terminal; and
a third voltage providing device, comprising a first terminal coupled to the second terminal of the third switch device, and comprising a second terminal coupled to an output terminal.

10. The I/O driving circuit of claim 9, wherein the pre-driver further comprises:
a first pre-driving block, coupled to the third switch device and the third voltage providing device, wherein the first pre-driving block operates between the I/O voltage and a bias voltage to generate a third control signal for controlling the third switch device, and to generate a fourth control signal for controlling the third voltage providing device.

11. An I/O driving circuit, comprising:
a post driver, comprising:
a first switch device, comprising a first terminal coupled to an I/O voltage, and comprising a second terminal, wherein the first switch device provides an initial driving voltage at the second terminal of the first switch device; and
a first voltage providing device, comprising a first terminal coupled to the second terminal of the first switch device, and comprising a second terminal, wherein the first voltage providing device is configured to provide a driving voltage at the second terminal of the first voltage providing device via providing a voltage drop to the initial driving voltage;
a third switch device, comprising a first terminal coupled to the I/O voltage, and comprising a second terminal; and
a third voltage providing device, comprising a first terminal coupled to the second terminal of the third switch device, and comprising a second terminal coupled to an output terminal; and
a pre-driver, comprising:
a first pre-driving block, coupled to the third switch device and the third voltage providing device, wherein the first pre-driving block operates between the I/O voltage and a bias voltage to generate a third control signal for controlling the third switch device, and to generate a fourth control signal for controlling the third voltage providing device.

12. An I/O driving circuit, comprising:
a post driver, comprising:
a first switch device, comprising a first terminal coupled to an I/O voltage, and comprising a second terminal, wherein the first switch device provides an initial driving voltage at the second terminal of the first switch device; and
a first voltage providing device, comprising a first terminal coupled to the second terminal of the first switch device, and comprising a second terminal, wherein the first voltage providing device is configured to provide a driving voltage at the second terminal of the first voltage providing device via providing a voltage drop to the initial driving voltage;
wherein an oxide layer of the first switch device is thicker than an oxide layer of the first voltage providing device;
wherein the first switch device is an I/O device, and the first voltage providing device is a core device;
wherein the first switch device is a PMOSFET, and the first voltage providing device is a NMOSFET.

13. An I/O driving circuit, comprising:
a post driver, comprising:
a first switch device, comprising a first terminal coupled to an I/O voltage, and comprising a second terminal, wherein the first switch device provides an initial driving voltage at the second terminal of the first switch device; and
a first voltage providing device, comprising a first terminal coupled to the second terminal of the first switch device, and comprising a second terminal, wherein the first voltage providing device is configured to provide a driving voltage at the second terminal of the first voltage providing device via providing a voltage drop to the initial driving voltage; and
a pre-driver, comprising:
a third pre-driving block, coupled to the first voltage providing device, wherein the third pre-driving block operates between the I/O voltage and a bias voltage to generate a second control signal for controlling the first voltage providing device;
wherein an oxide layer of the first switch device is thicker than an oxide layer of the first voltage providing device.

14. An I/O driving circuit, comprising:
a post driver, comprising:
a first switch device, comprising a first terminal coupled to an I/O voltage, and comprising a second terminal, wherein the first switch device provides an initial driving voltage at the second terminal of the first switch device; and
a first voltage providing device, comprising a first terminal coupled to the second terminal of the first switch device, and comprising a second terminal, wherein the first voltage providing device is configured to provide a driving voltage at the second terminal of the first voltage providing device via providing a voltage drop to the initial driving voltage;
wherein an oxide layer of the first switch device is thicker than an oxide layer of the first voltage providing device;

wherein the I/O driving circuit further comprises an output terminal, wherein the second terminal of the first voltage providing device is coupled to the output terminal, wherein the post driver further comprises:

a second switch device, comprising a first terminal coupled to the output terminal, and comprising a second terminal; and a second voltage providing device, comprising a first terminal coupled to the second terminal of the second switch device, and comprising a second terminal coupled to a ground voltage;

wherein the I/O driving circuit further comprises a pre-driver, wherein the pre-driver further comprises:

a fourth pre-driving block, coupled to the second voltage providing device wherein the fourth pre-driving block operates between a core voltage and the ground voltage to generate a fifth control signal to the second voltage providing device;

wherein the second switch device comprises a control terminal receiving the core voltage.

* * * * *